United States Patent [19]
Song

[11] Patent Number: 5,882,534
[45] Date of Patent: *Mar. 16, 1999

[54] METHOD FOR FABRICATING A MULTISTAGE PHASE SHIFT MASK

[75] Inventor: Young Jin Song, Chungcheongbuk-do, Rep. of Korea

[73] Assignee: LG Semicon Co., Ltd., Chungcheongbuk-Do, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 443,398

[22] Filed: May 17, 1995

[51] Int. Cl.$^6$ ....................................................... G03F 1/00
[52] U.S. Cl. ................................................. 216/12; 430/5
[58] Field of Search .................................. 430/5; 216/12; 438/713

[56] References Cited

U.S. PATENT DOCUMENTS

| | | | |
|---|---|---|---|
| 5,288,568 | 2/1994 | Cathey, Jr. | 430/5 |
| 5,403,682 | 4/1995 | Lin | 430/5 |
| 5,437,947 | 8/1995 | Hur et al. | 430/5 |
| 5,487,962 | 1/1996 | Rolfson | 430/5 |

OTHER PUBLICATIONS

Hisashi Watanabe, Yoshihiro Todokoro, Yoshihiko Hirai and Morio Inoue, "Transparent phase shifting mask with multistage phase shifter and comb–shaped shifter", SPIE vol. 1463 Optical/Laser Micro–lithography IV (1991), pp. 101–110.

*Primary Examiner*—Bernard Codd
*Attorney, Agent, or Firm*—Morgan, Lewis & Bockius LLP

[57] ABSTRACT

A multistage phase shift mask includes a light transmissive substrate having light shielding regions and light transmissive regions. A shielding layer is disposed on the shielding regions of the substrate and a phase shifter layer extends over the light transmissive regions between a pair of the shielding regions. A first etched portion on the substrate is adjacent to the phase shifter layer that contacts with the substrate and a second etched portion on the substrate is between the phase shifter layer and the first etched portion of the substrate.

The second etched portion consists of a gradual concave slope allowing a phase shift from approximately 0 to 180 degrees.

9 Claims, 14 Drawing Sheets

METHOD FOR FABRICATING A MULTISTAGE PHASE SHIFT MASK

BACKGROUND OF THE INVENTION

1. Field of the Invention

The present invention relates to a multistage phase shift mask, and more particularly, to a simplified method for fabricating a multistage phase shift mask for preventing a bridge pattern from generation at edge of an alternating phase shift mask.

2. Dissussion of the Related Art

FIG. 1 is a plan view of a conventional alternating phase shift mask and FIG. 2A is a cross-sectional view of the phase shift mask along a line A–A' in FIG. 1. Referring to FIGS. 1 and 2, a general phase shift mask 10 is formed by depositing a chrome thin film on a quartz substrate having a high light transmittance, patterning the same, selectively forming opaque chrome patterns 12, and forming a phase shift layer 13 stretching over an adjacent pair of chrome patterns 12. An amplitude of the light passing through the phase shift mask formed as described above is shown in FIG. 2B. The amplitude and intensity of the light incident onto a wafer through the phase shift mask are shown in FIGS. 2C and 2D, respectively. When using the phase shift mask 10 shown in FIG. 1, the phase of the light transmitting through the phase shift layer 13 is shifted by 180° with respect to the light transmitted through the transmissive quartz substrate 11. The substantial intensity of the light incident onto the wafer is shown in FIG. 2C.

Therefore, if the photosensitive film of the wafer is exposed and developed using the phase shift mask 10, a good quality photosensitive pattern can be obtained in the direction of A–A' in FIG. 1.

FIG. 3A is a cross-sectional view of the phase shift mask along a line B–B' in FIG. 1.

The phase shift mask 10 has a structure such that the phase shift layer 13 is directly on the quartz substrate 11 in the direction of B–B' in FIG. 1. In the direction of B–B', the amplitude and intensity of a light incident onto a wafer through the phase shift mask are shown in FIGS. 3B and 3C, respectively. Therefore, if the photosensitive film of the wafer is exposed using the phase shift mask 10, a phase difference of 180° from the light transmitted through the transmissive quartz substrate 11 and the light transmitted through the phase shift layer 13 as shown in FIG. 3B at an edge "E" of the phase shift layer 13 (FIG. 1) which contacts with the quartz substrate 11.

Therefore, a portion where the intensity of the light incident onto the wafer becomes zero is present, as shown in FIG. 3C. If a positive photosensitive layer is used, an undesired photosensitive layer is generated at a portion "E" of the phase shift layer shown in FIG. 1, which is called a bridge pattern.

The phase shift mask 10 has a problem in that an undesired bridge pattern is generated at the edge ("E" in FIG. 1) of the phase shift layer which directly contacts with the substrate between chrome patterns.

In order to solve such a bridge pattern problem of the alternating phase shift mask, a conventional stepped multistage phase shift mask, shown in FIG. 4, has been proposed.

FIG. 4 is a perspective view of a conventional stepped multistage phase shift mask.

Referring to FIG. 4, the conventional stepped multistage phase shift mask 20 is formed by stepwise etching a substrate a portion of which directly contacts with the edge of the phase shift layer 23, in order to solve the problem of a bridge pattern that is generated at the phase shift mask shown in FIG. 1. Through the conventional multistage phase shift mask, the phases are shifted to 60°, 120° and 180° at the portions corresponding to the light transmissive regions where the substrate directly contacts with the phase shift layer. Thus, a bridge pattern is prevented from being generated at "E." That is to say, by preventing the light intensity from becoming zero at "E," when the positive photosensitive layer is exposed and developed using the conventional stepped multistage phase shift mask, an unnecessary bridge pattern generation is prevented.

FIGS. 5A to 5H are cross-sectional views along a line C–C' in FIG. 4 showing a fabricating process of the conventional stepped multistage phase shift mask. FIGS. 6A to 6H are cross-sectional views along a line D–D' in FIG. 4 showing a fabricating process of the conventional stepped multistage phase shift mask.

The method for fabricating the conventional stepped multistage phase shift mask will now be described with reference to FIGS. 5A to 6H.

As shown in FIGS. 5A and 6A, a chrome thin film 22 is formed on a clean quartz substrate 21, a photosensitive layer 24A is deposited and patterned on the chrome thin film 22 to define a transmissive region T and shielding region S. At this time, the chrome thin film 22, which is the transmissive region, is exposed.

As shown in FIGS. 5B and 6B, the chrome thin film 22 of the transmissive region T is etched, using the photosensitive layer 24A as a mask. The chrome thin film 22 remaining in the shielding region S serves as a shielding layer. The remaining photosensitive layer 24A is removed.

As shown in FIGS. 5C and 6C, a phase shift layer 23 is deposited on the quartz substrate 21 containing the shielding layer and is etched so as to leave the phase shift layer 23 between an adjacent pair of shielding layers. At this time, in the direction of A–A', the edge of the phase shift layer 23 is formed on the shielding layer so that the edge of the phase shift layer 23 does not directly contact with the transmissive quartz substrate 21. However, in the direction of B–B', the edge ("E") of the phase shift layer 23 is not formed on the shielding layer so that the edge of the phase shift layer 23 directly contacts with the transmissive quartz substrate 21.

As shown in FIGS. 5D and 6D, a photosensitive layer 24B is deposited again on the whole surface of the substrate and is patterned so as to expose the portion "E" of the substrate 21 which is a transmissive region.

The exposed substrate is primarily etched be a constant depth using the photosensitive layer 24B as a mask. At this time, the light transmitting through the primarily etched portion 21A has a phase shift of 60° with respect to the light transmitting through the unetched substrate.

As shown in FIGS. 5E and 6E, the photosensitive layer 24B is removed, and a photosensitive layer 24C is deposited again on the whole surface of the substrate. The photosensitive layer 24C is patterned so as to expose the primarily etched portion 21A. The exposed substrate is again etched to a constant depth using the photosensitive layer 24C as a mask. After the second etching, the photosensitive layer 24C is removed, as shown as FIGS. 5F and 6F. At this time, the light transmitting through the second etched portion 21B has a phase shift of 60° with respect to the light transmitting through the primarily etched portion 21A, and thus has a phase shift of 120° with respect to the light transmitting through the unetched substrate.

As shown in FIGS. 5G and 6G, a photosensitive layer 24D is deposited again on the whole surface of the substrate and is patterned so as to expose the second etched portion 21B. The exposed substrate 21B is again etched using the photosensitive layer 24C as a mask to obtain a multistage phase shift mask 20 of which the substrate being between an adjacent pair of chrome patterns are etched stepwise. At this time, the light transmitting through the third etched portion 21 has a phase shift of 60° with respect to the light transmitting through the second etched portion 21B, and thus has a phase shift of 180° with respect to the light transmitting through the unetched substrate.

FIG. 7A is a cross-sectional view of the multistage phase shift mask fabricated by the aforementioned process, and FIG. 7B shows the intensity of the light incident onto a wafer via the multistage phase shift mask shown in FIG. 7A.

According to the conventional stepped multistage phase shift mask 20, three steps of etching processes are executed for shifting phases, each with a phase difference of 60°, i.e., 60° to 120°, and to 180°. However, many more processes need to be executed for shifting phases with a less than 60° phase difference.

In the case of the conventional stepped multistage phase shift mask 20, the portion where the phase is shifted with respect to the incident light is stepped. Hence, the phase is stepwise shifted to 60°, 120°, and 180°, thereby preventing a rapid decline in light intensity. Therefore, a bridge pattern is not generated, unlike the case in which a positive photosensitive layer is patterned using the phase shift mask shown in FIG. 1. However, in order to prevent the generation of the bridge pattern, a multistage substrate etching process needs to be executed. Thus, the process is complicated, and a misalignment of a photomask may occur.

Summary of the Invention

It is an object of the present invention to solve the above-described problems, and provide a method for fabricating a simplified multistage phase shift mask.

To accomplish the above object, a method for fabricating a simplified multistage phase shift mask according to the present invention comprises the steps of:

defining a transmissive substrate into a shielding region and a transmissive region;

forming a shielding layer on the shielding region of the substrate;

forming a phase shifter extending over the transmissive region between an adjacent pair of shielding layers;

primarily etching the substrate being in the adjacent region of the phase shifter which contacts with the substrate; and second etching the substrate between the phase shifter and the primarily etched substrate.

BRIEF DESCRIPTION OF THE DRAWINGS

The above objects and advantages of the present invention will become more apparent by describing in detail a preferred embodiment thereof with reference to the attached drawings in which.

DETAILED DESCRIPTION OF THE INVENTION

Figure 1:
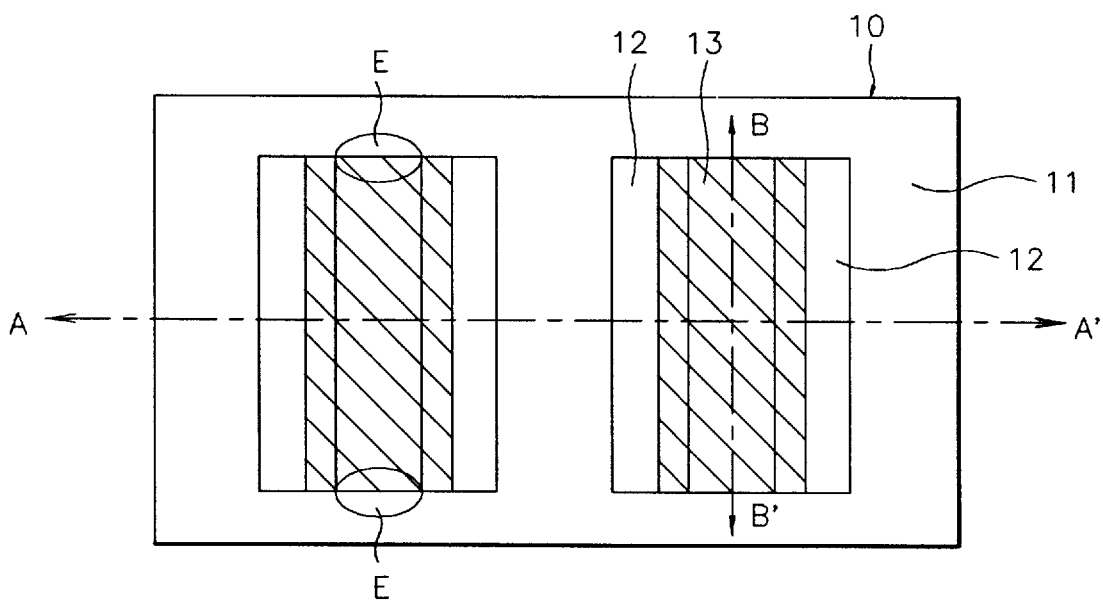
FIG. 1 is a plan view of a conventional alternating phase shift mask.
Figure 2A:
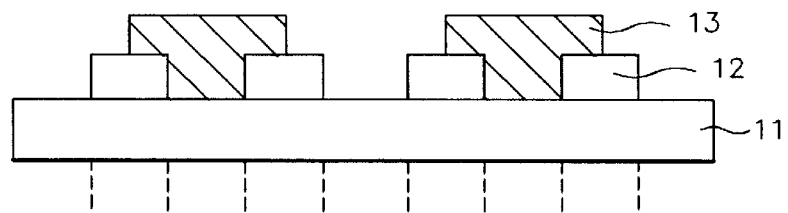
FIG. 2A is a cross-sectional view of the phase shift mask along a line A–A' in FIG. 1.
Figure 2B:
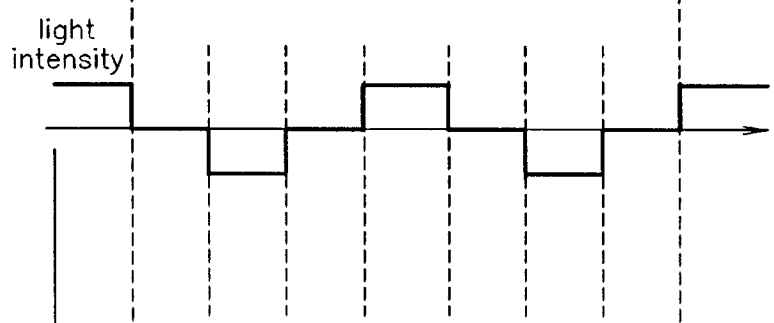
FIG. 2B shows the amplitude of the light passing through the phase shift mask shown in FIG. 2A.
Figure 2C:
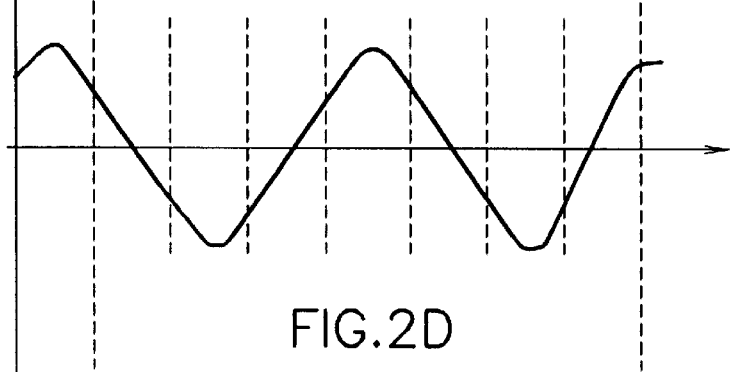
FIGS. 2C and 2D show the amplitude and intensity of the light incident onto a wafer through the phase shift mask shown in FIG. 2A, respectively.
Figure 2D:
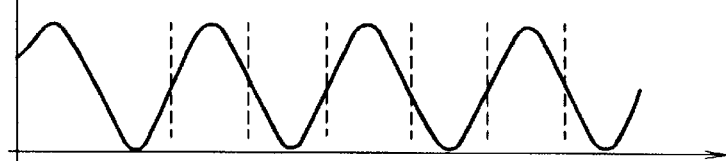
Figure 3A:
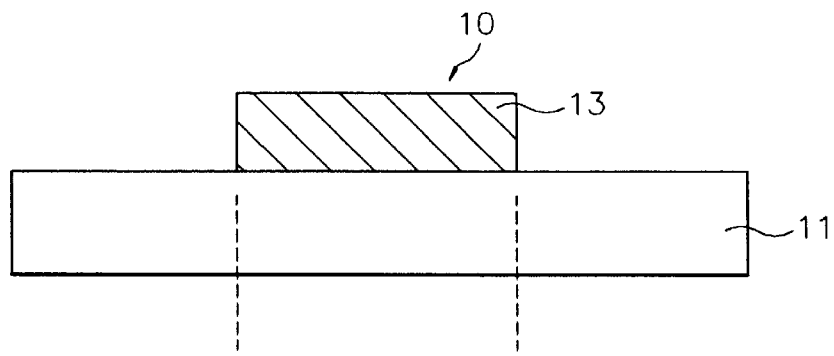
FIG. 3A is a cross-sectional view of the phase shift mask along a line B–B' in FIG. 1.
Figure 3B:
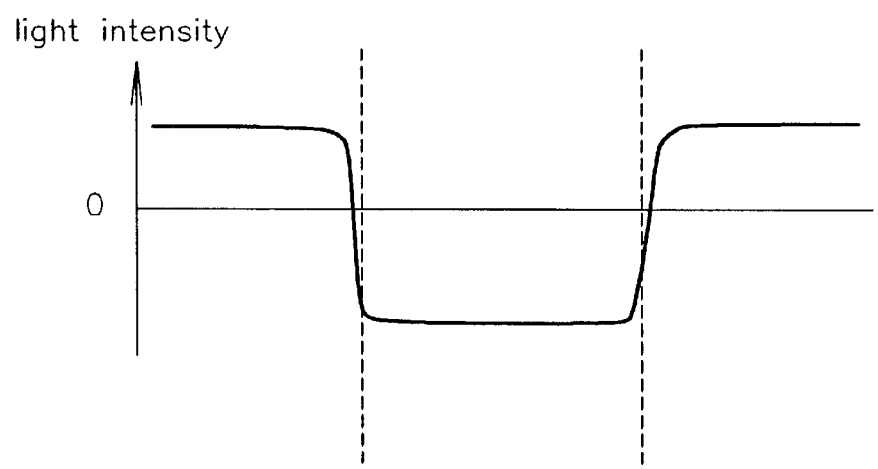
FIGS. 3B and 3C show the amplitude and intensity of the light incident onto a wafer through the phase shift mask shown in FIG. 3A, respectively.
Figure 3C:
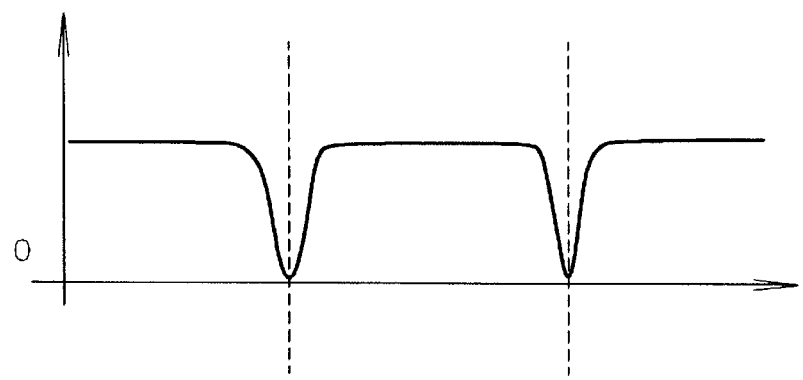
Figure 4:
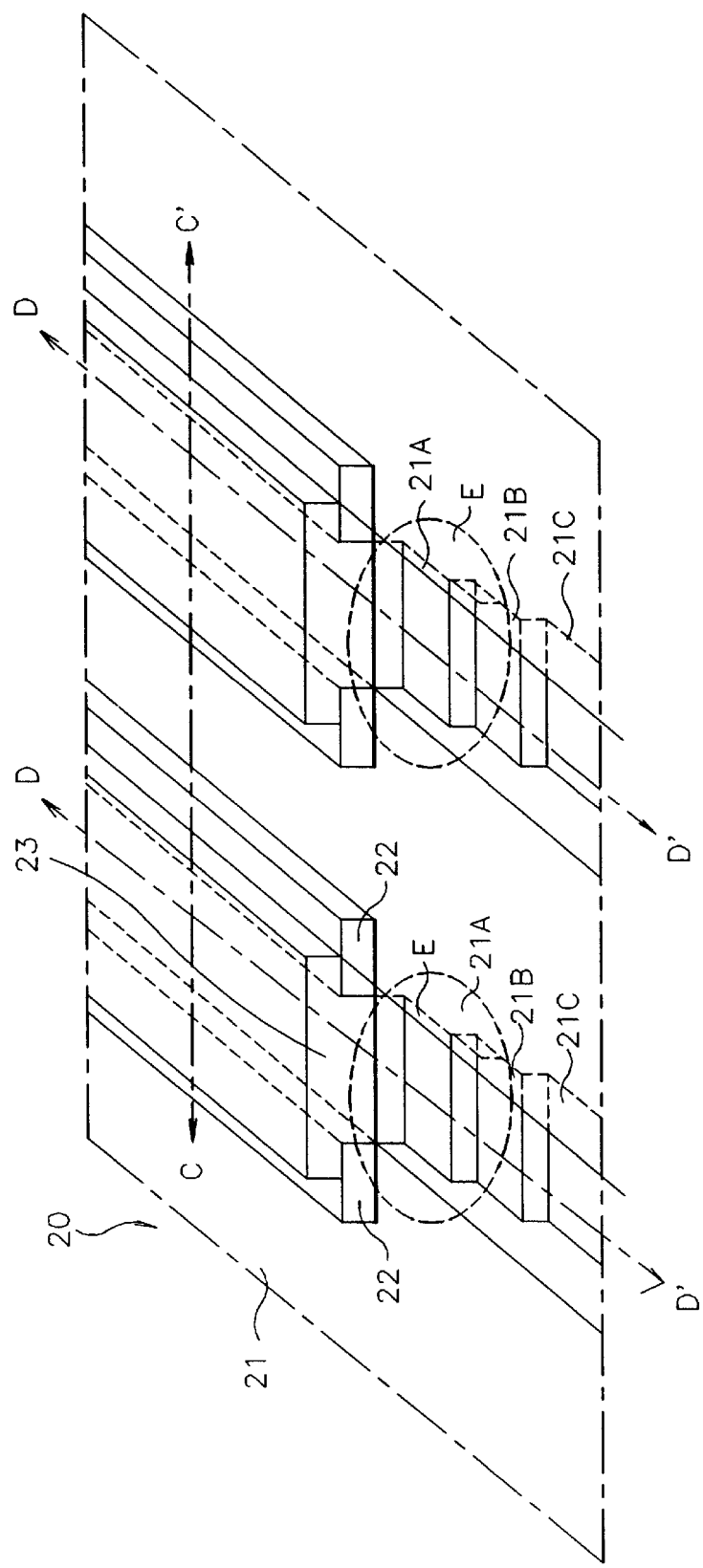
FIG. 4 is a perspective view of a conventional stepped multistage phase shift mask.
Figure 5A:
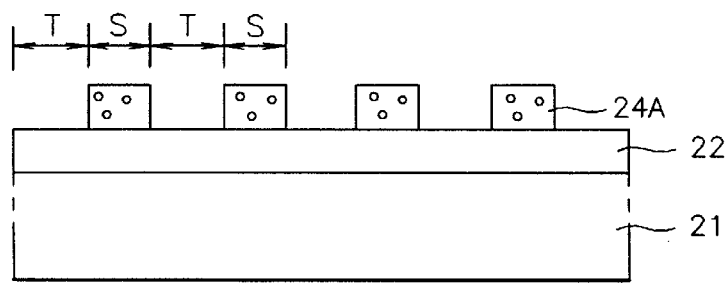
FIGS. 5A to 5H are cross-sectional views showing a fabrication process of the conventional stepped multistage phase shift mask along a line C–C' in FIG. 4.
Figure 5B:
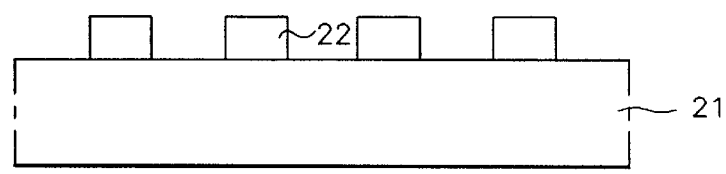
Figure 5C:
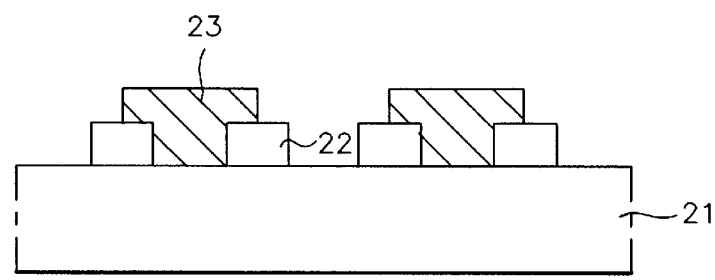
Figure 5D:
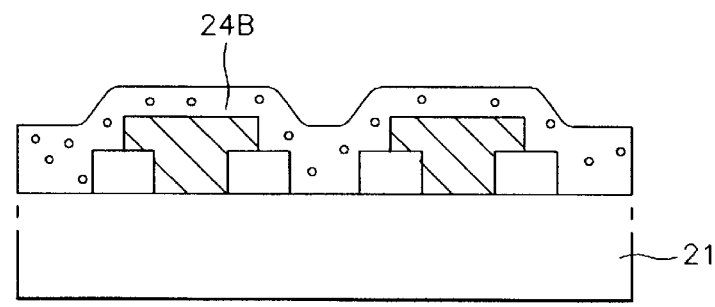
Figure 5E:
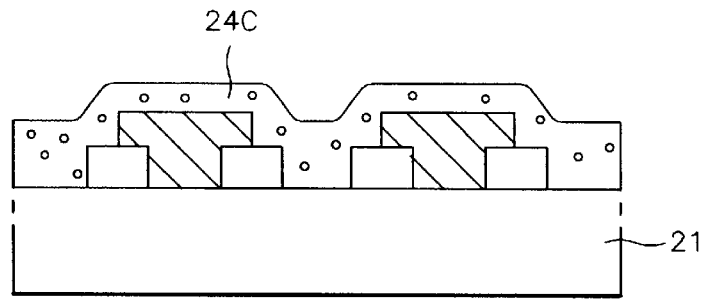
Figure 5F:
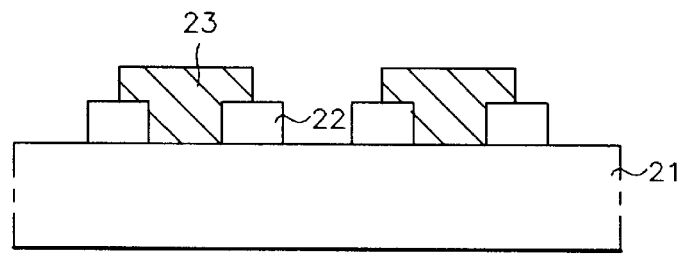
Figure 5G:
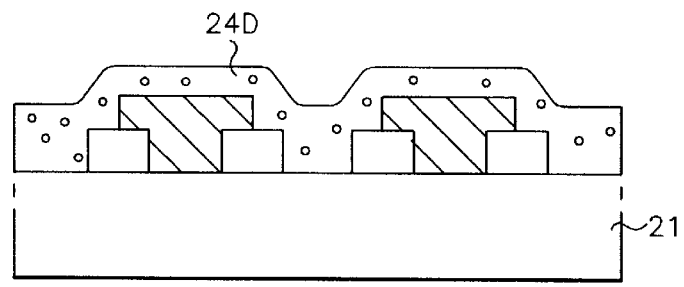
Figure 5H:
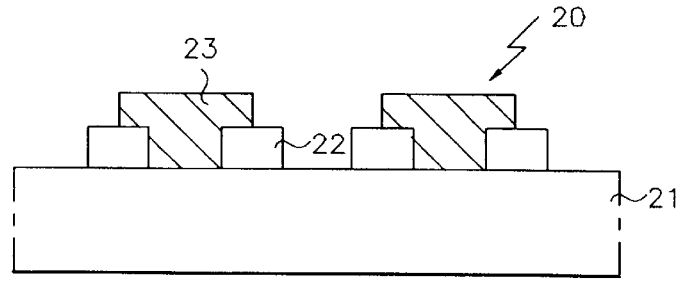
Figure 6A:
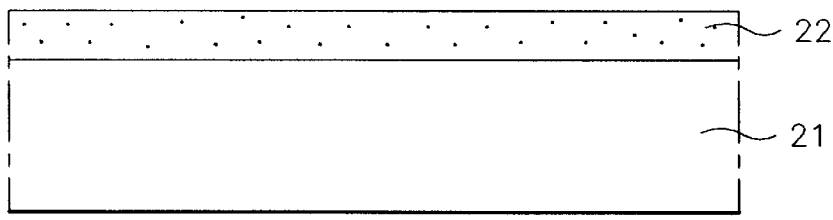
FIGS. 6A to 6H are cross-sectional views showing a fabrication process of the conventional stepped multistage phase shift mask along a line D–D' in FIG. 4.
Figure 6B:
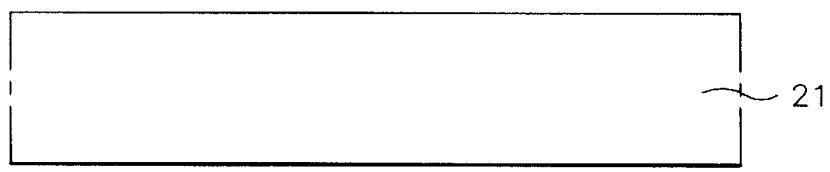
Figure 6C:
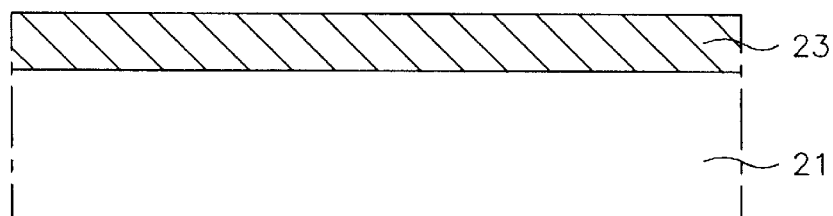
Figure 6D:
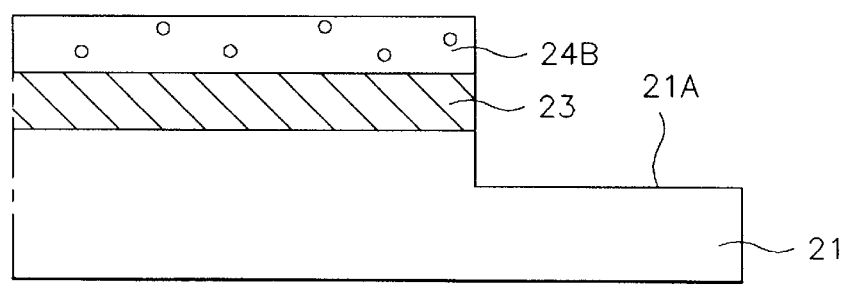
Figure 6E:
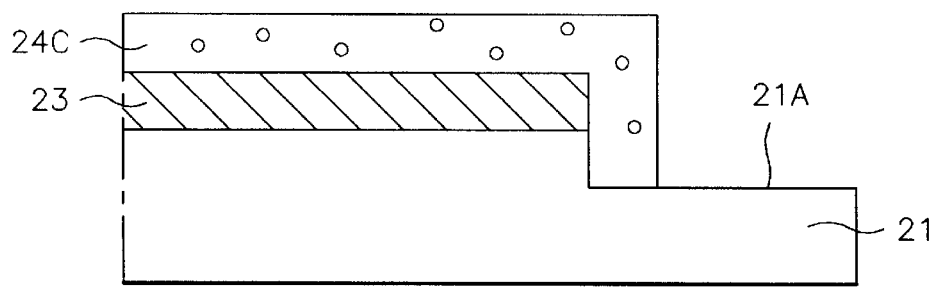
Figure 6F:
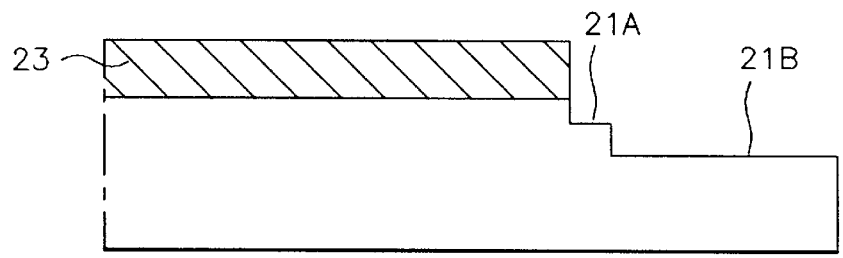
Figure 6G:
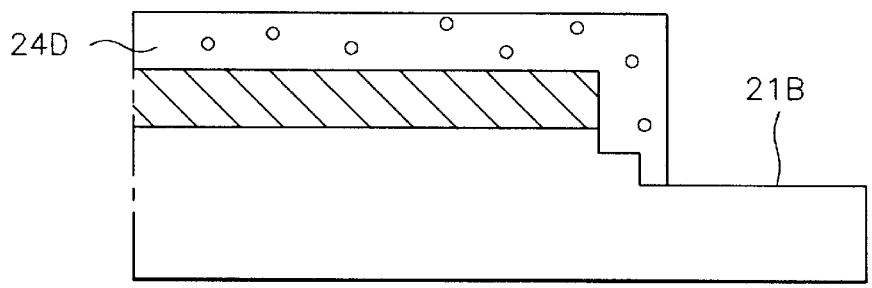
Figure 6H:
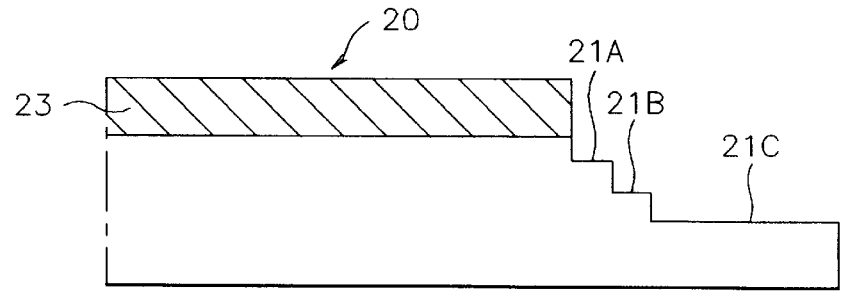
Figure 7A:
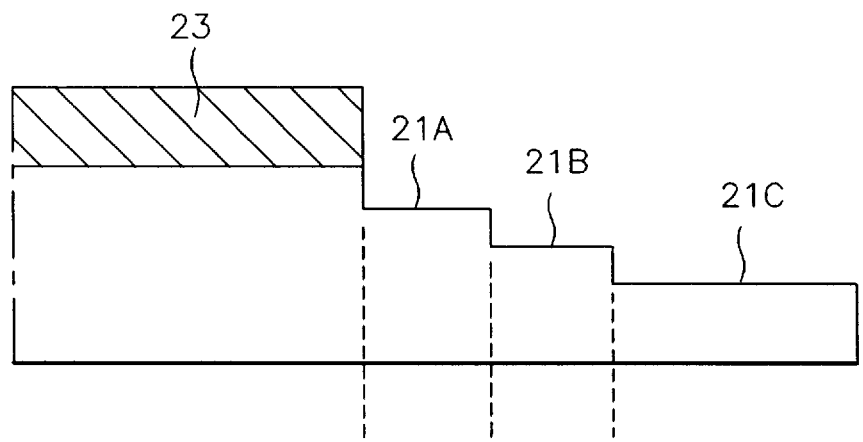
FIG. 7A is a cross-sectional view of the stepped multistage phase shift mask along a line D–D' in FIG. 4.
Figure 7B:
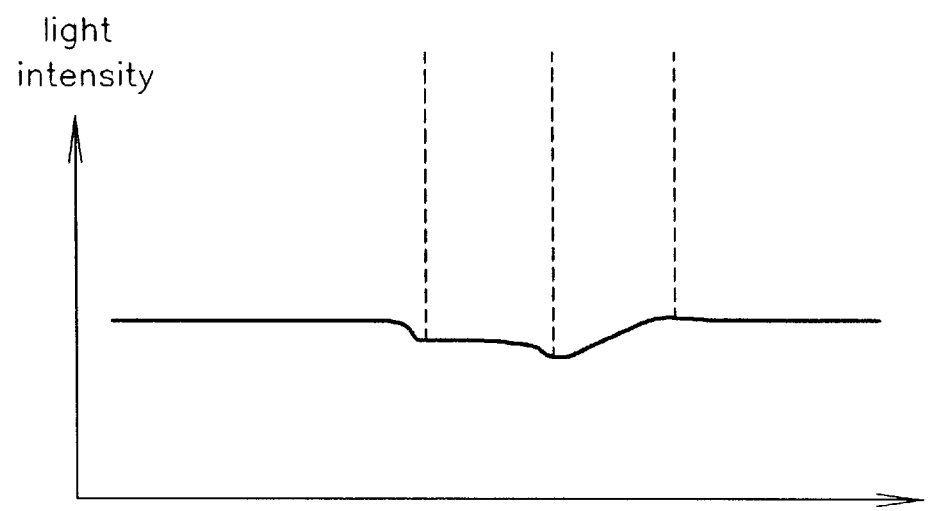
FIG. 7B shows the amplitude of the light incident onto a wafer through the stepped multistage phase shift mask shown in FIG. 7A.
Figure 8:
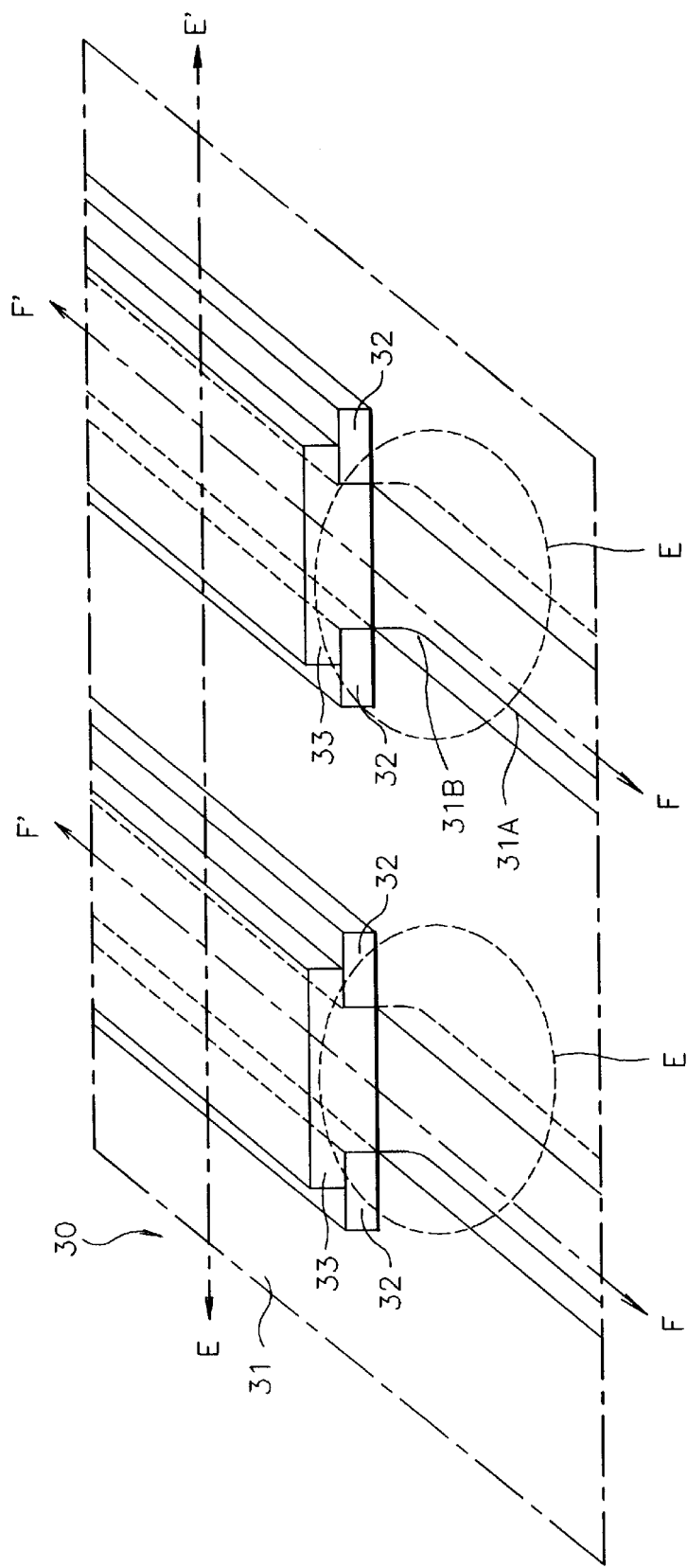
FIG. 8 is a perspective view of a multistage phase shift mask according to the present invention.

Referring to FIG. 8, in the multistage phase shift mask according to the present invention, a phase shifter gradually shifts a phase from 0° to 180° and is formed on a portion where the phase shift layer directly contacts with a substrate. The phase shifter of the present invention for gradually shifting the phase is implemented by gradually etching the substrate of a portion "E" to form a sloped plane. Therefore, the phase of the light changes gradually from 0° to 180° through the etched portion.

FIGS. 9A to 9H are cross-sectional views showing the fabricating process of the multistage phase shift mask according to an embodiment of the present invention along a line E–E' in FIG. 8. FIGS. 10A to 10I are cross-sectional views showing the fabricating process of the multistage phase shift mask according to an embodiment of the present invention along a line F–F' in FIG. 8. The method for fabricating the multistage phase shift mask will be described with reference to these drawings.

Figure 9A:
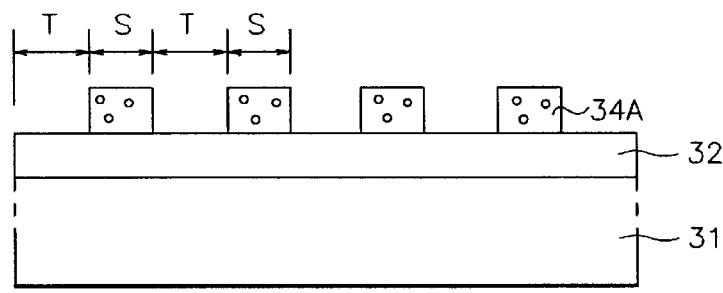
FIGS. 9A to 9I are cross-sectional views showing the fabrication process of the multistage phase shift mask according to an embodiment of the present invention along a line E–E' in FIG. 8.
Figure 9B:
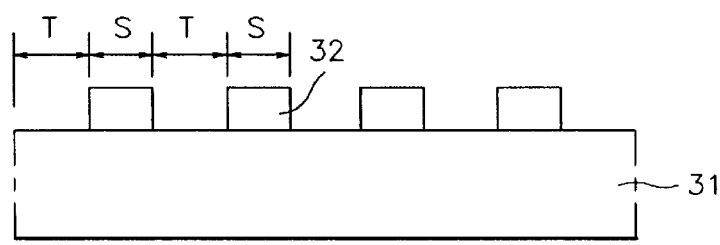
Figure 10A:
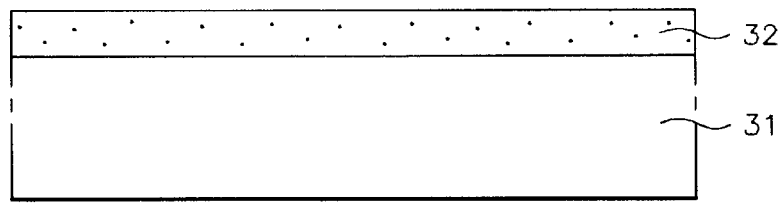
FIGS. 10A to 10I are cross-sectional views showing the fabrication process of the multistage phase shift mask according to an embodiment of the present invention along a line F–F' in FIG. 8.
Figure 10B:
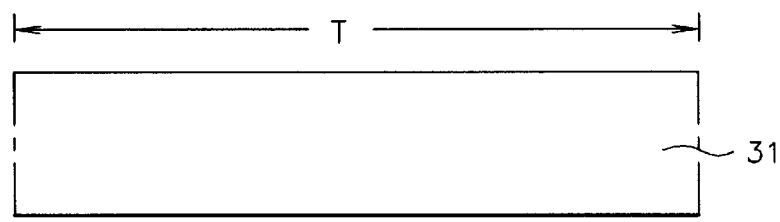

As shown in FIGS. 9A and 10A, a chrome thin film 32 is deposited on a quartz substrate 31 and a photosensitive layer 34A is deposited thereon. The photosensitive layer 34A is patterned to define a transmissive region T and a shielding region S. The chrome thin film 32 which is the transmissive region, is exposed.

Figure 9C:
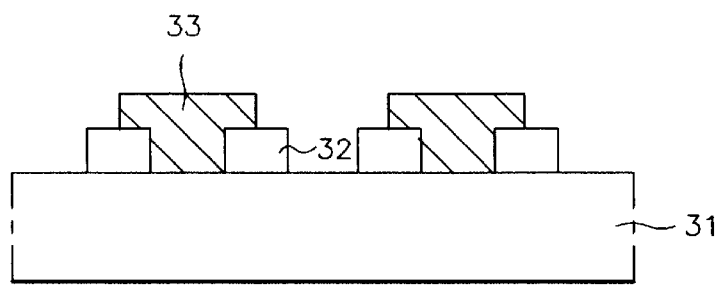
Figure 10C:
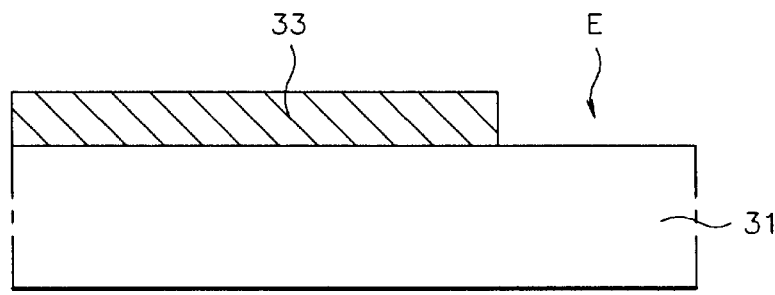

As shown in FIGS. 9C and 10C, as a first phase shifter, a phase shift layer 33 is formed extending over an adjacent pair of shielding layers. At this time, in the direction of F–F', the shielding layer is not formed at the edge ("E") of the phase shift layer 33. Hence, the edge of the phase shift layer 33 directly contacts with the transmissive substrate 31.

Figure 9D:
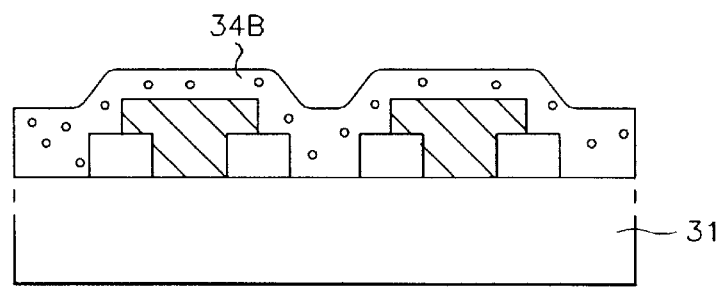
Figure 10D:
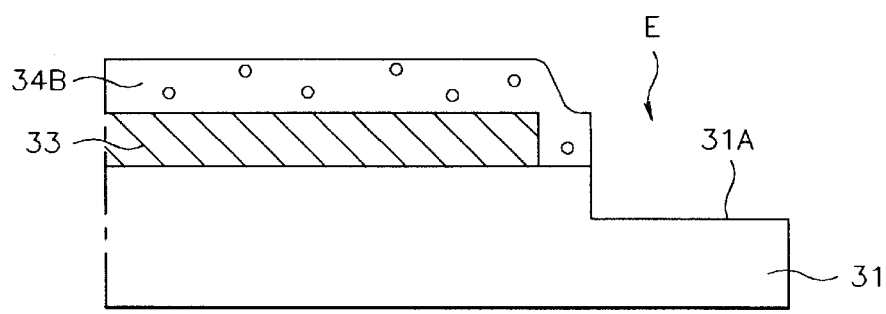

The processes after those shown in FIGS. 9D and 10D are for implementing a second phase shifter on the substrate which is the transmissive region where the first phase shifter directly contacts with the substrate.

That is to say, as shown in FIGS. 9D and 10D, the photosensitive layer 34B is deposited again on the whole surface of the substrate and is patterned so that the substrate of the portion "E" is partially exposed. Accordingly, the substrate of the transmissive region present between the shielding layers 32's is covered by the photosensitive layer 34B. The substrate without the shielding layer formed thereon, however being of the transmissive region which directly contacts with the phase shift layer, is partially exposed. The exposed substrate is primarily etched to a constant depth using the photosensitive layer 34B as a mask.

Figure 9E:
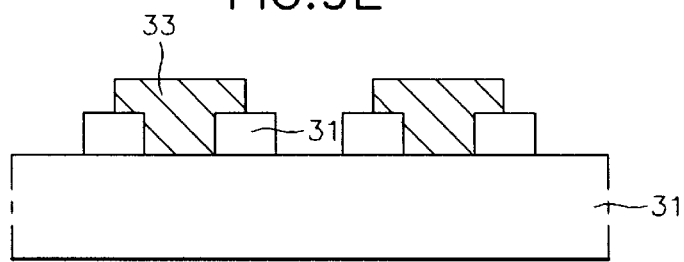
Figure 10E:
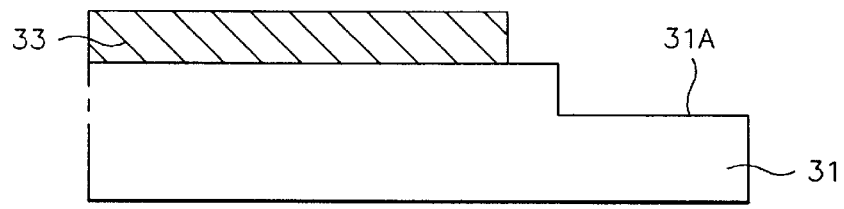

As shown in FIGS. 9E and 10E, the photosensitive layer 34B is removed to expose the primarily etched portion 31A and the substrate 31B of the both transmissive regions of the primarily etched portion 31A.

At this time, the primarily etched portion 31A is etched by a depth (d) where the light passing through the etched portion 31A is phase-shifted to 180° with respect to the light passing through the unetched portion 31B.

The relationship between the wavelength (λ) of the incident light and the depth (d) can be expressed as follows:

$$d = \frac{\lambda}{2(n-1)}$$

where n indicates a refractive index.

Figure 9F:
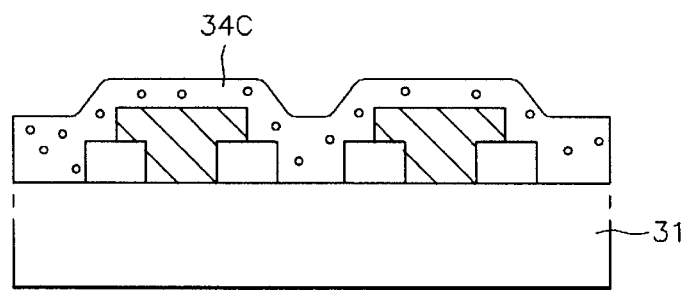
Figure 9G:
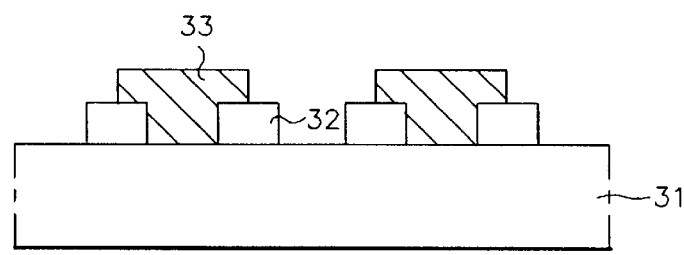
Figure 10F:
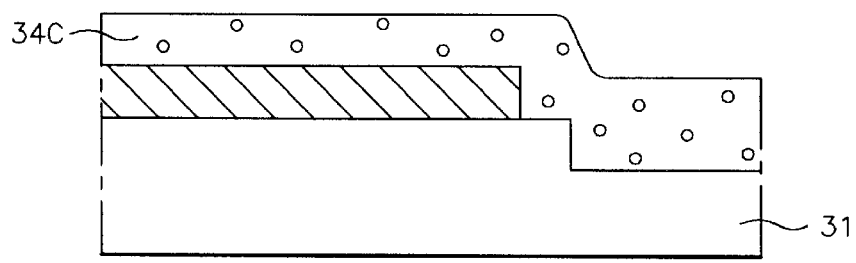
Figure 10G:
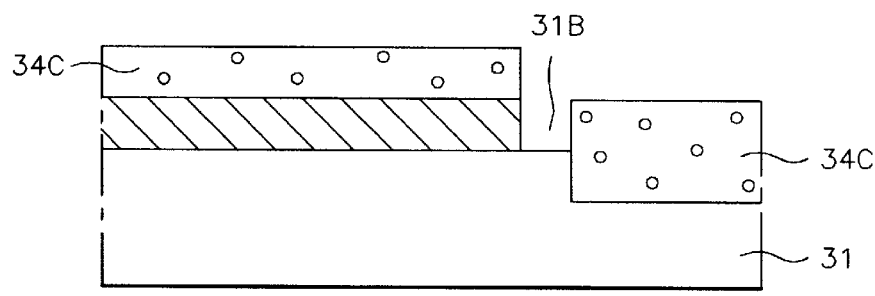

As shown in FIGS. 9F and 10F, the photosensitive layer 34C is deposited again on the whole surface of the substrate. Then, the photosensitive layer 34C is patterned so as to expose the substrate 31B being between the primarily etched portion 31A and the phase shift layer 33, as shown in FIGS. 9G and 10G.

Figure 9H:
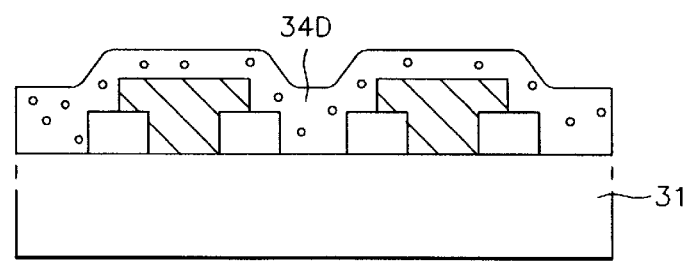
Figure 9I:
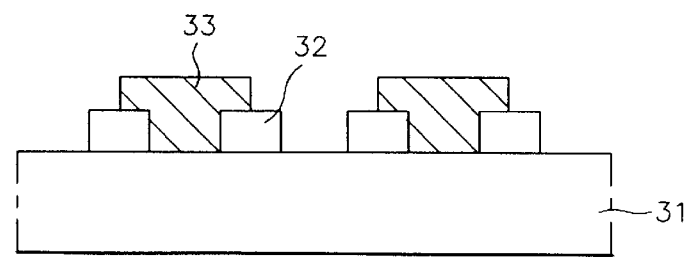
Figure 10H:
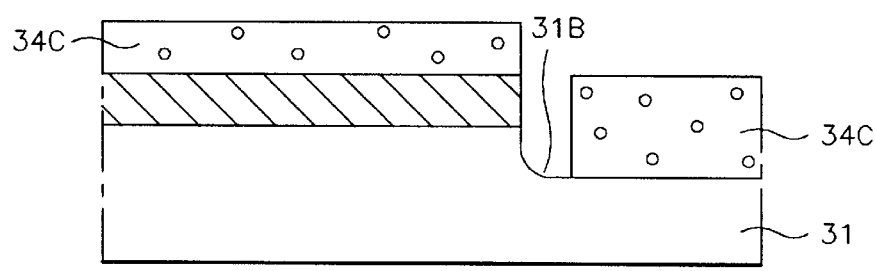
Figure 10I:
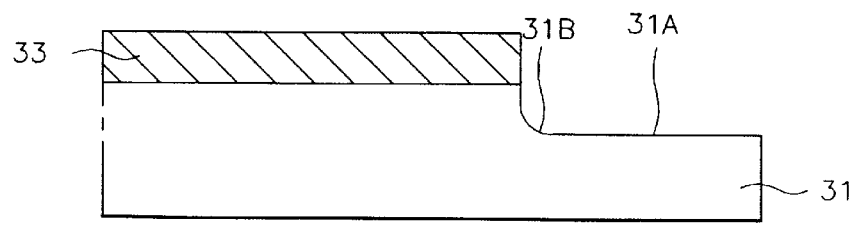

As shown in FIGS. 9H and 10H, the exposed substrate 31B is again isotropically etched in a constant depth using the photosensitive layer 34C as a mask. The remaining photosensitive layer 34C is removed to obtain the multistage phase shift mask 30 according to the embodiment of the present invention, as shown in FIGS. 9I and 10I.

At this time, the second etched portion 31B has a smaller etching depth than that of the primarily etched portion 31A, and is isotropically etched so as to have an etching plane having gradual slopes. Thus, the light passing through the second etched portion 31B is phase-shifted gradually from 0° to 180°.

As described above, according to the present invention, the substrate is etched only twice to form phase-shifted portions, thereby shifting the phases of the incident light gradually from 0° to 180°. Therefore, the multistage phase shift mask can be fabricated by a simplified process and unnecessary bridge pattern of the transmissive region is not generated.

What is claimed is:

1. A method for fabricating a multistage phase shift mask comprising the steps of:
    defining a transmissive substrate into shielding regions and transmissive regions;
    forming a shielding layer on the shielding regions of the substrate;
    forming a phase shifter layer extending over the transmissive regions between a pair of the shielding regions;
    first etching the substrate at an adjacent region of the phase shifter layer that contacts with the substrate; and
    second etching the substrate between the phase shifter layer and the first etched substrate, wherein the second etching step consists of isotropically etching the substrate to have a concave shape to allow a gradual phase shift from approximately 0° to 180°, and wherein the first and second etching steps complete the formation of the phase shift layer.

2. A method for fabricating a multistage phase shift mask as claimed in claim 1, wherein the first etching step includes etching the substrate to a depth allowing a phase shift approximately to 180°.

3. A method for fabricating a multistage phase shift mask as claimed in claim 1, wherein the first etching step uses an anisotropic etching method.

4. A method for fabricating a multistage phase shift mask as claimed in claim 1, wherein the first etching step includes the steps of:
    depositing a photosensitive layer on the shielding layer, the phase shifter layer, and the substrate;
    exposing the substrate where the shielding layer is not formed at an adjacent region of the phase shifter layer that directly contacts the substrate; and
    anisotropically etching the exposed region.

5. A method for fabricating a multistage phase shift mask comprising the steps of:
    defining a transmissive substrate into shielding regions and transmissive regions;
    forming a shielding layer on the shielding regions of the substrate;
    forming a phase shifter layer extending over the transmissive regions between a pair of the shielding regions;
    first etching the substrate at an adjacent region of the phase shifter layer that contacts with the substrate; and
    second etching the substrate between the phase shifter layer and the first etched substrate, wherein the second etching step consists of:
        depositing a photosensitive layer on the substrate containing a shielding layer, the phase shifter, and the first etched portion;
        exposing the substrate between the phase shifter and the first etched portion; and
        isotropically etching the exposed substrate to have a concave shape to allow a gradual phase shift from approximately 0° to 180°, and wherein the first and second etching steps complete the formation of the phase shift layer.

6. A method for fabricating a multistage phase shift mask as claimed in claim 1, wherein the pair of the shielding regions in the step of forming the phase shifter layer extending over the transmissive regions are adjacent to each other.

7. A multistage phase shift mask comprising:
    a light transmissive substrate having light shielding regions and light transmissive regions;
    a shielding layer disposed on the light shielding regions of the substrate;
    a phase shifter layer extending over the light transmissive regions between a pair of the light shielding regions;
    a first etched portion on the substrate adjacent to the phase shifter layer that contacts with the substrate; and
    a second etched portion on the substrate between the phase shifter layer and the first etched portion of the substrate, wherein the second etched portion consists of a gradual concave slope allowing a phase shift from approximately 0 to 180 degrees.

8. A multistage phase shift mask as claimed in claim 7, wherein the first etched portion has a depth allowing a phase shift of approximately 180 degrees.

9. A multistage phase shift mask as claimed in claim 7, wherein the pair of the light shielding regions are adjacent to each other.

* * * * *